US007239181B2

United States Patent
Himi et al.

(10) Patent No.: US 7,239,181 B2
(45) Date of Patent: Jul. 3, 2007

(54) SEMICONDUCTOR DEVICE

(75) Inventors: Hiroaki Himi, Nagoya (JP); Akira Yamada, Nukata-gun (JP); Takeshi Kuzuhara, Nukata-gun (JP)

(73) Assignee: DENSO Corporation, Kariya (JP)

( * ) Notice: Subject to any disclaimer, the term of this patent is extended or adjusted under 35 U.S.C. 154(b) by 97 days.

(21) Appl. No.: 11/253,678

(22) Filed: Oct. 20, 2005

(65) Prior Publication Data
US 2006/0087343 A1 Apr. 27, 2006

(30) Foreign Application Priority Data
Oct. 22, 2004 (JP) ............................. 2004-308724
Aug. 4, 2005 (JP) ............................. 2005-227058

(51) Int. Cl.
H03K 19/0175 (2006.01)
(52) U.S. Cl. ............................ 326/82; 326/63; 326/68; 326/83
(58) Field of Classification Search ............ 326/61–63, 326/68, 82–83, 88; 323/225–226, 270–271, 323/350–351; 257/239
See application file for complete search history.

(56) References Cited
U.S. PATENT DOCUMENTS
3,551,788 A * 12/1970 Summer ..................... 323/270
5,736,774 A 4/1998 Fujihira 2002/0125935 A1 * 9/2002 Sawada et al. ............. 327/536
2002/0186518 A1 12/2002 Nishikawa et al.

FOREIGN PATENT DOCUMENTS
KR 1999-0065165 8/1999

OTHER PUBLICATIONS
Akiyama et al. "Mitsubishi. Changes for the better." Mitsubishi Electric Corporation. International Symposium on Power Semiconductor Devices, 2004. (Discussed on p. 1 in the specification).
Notice of Preliminary Rejection from Korean Patent Office issued on Nov. 20, 2006 for the corresponding Korean patent application No. 10-2005-0099902 (a copy and English translation thereof).

* cited by examiner

Primary Examiner—Anh Q. Tran
(74) Attorney, Agent, or Firm—Posz Law Group, PLC

(57) ABSTRACT

A semiconductor device includes insulated and separated transistor elements successively connected to one another between ground potential and a predetermined potential. A transistor element at the GND potential side is a first stage and a transistor element at the predetermined potential side is an n-th stage. Resistance elements or capacitance elements are successively connected to one another in series between the GND potential and the predetermined potential. A resistance or capacitance element at the GND potential side is a first stage and a resistance or capacitance element at the predetermined potential side is an n-th stage. Gate terminals of the transistor elements at the respective stages excluding the transistor element at the first stage are successively connected to connection points. An output is taken from the terminal at the predetermined potential side of the transistor element of the n-th stage.

22 Claims, 10 Drawing Sheets

SEMICONDUCTOR DEVICE

CROSS REFERENCE TO RELATED APPLICATIONS

This application is based upon, claims the benefit of priority of, and incorporates by reference the contents of, Japanese Patent Application No. 2004-308724 filed on Oct. 22, 2004 and Japanese Patent Application No. 2005-227058 filed on Aug. 4, 2005.

TECHNICAL FIELD

The technical field relates to a semiconductor device applicable to a high voltage IC for driving an inverter or the like.

BACKGROUND

A high voltage IC for driving an inverter or the like is disclosed in, for example, Japanese Patent No. 3,384,399 (Patent Document 1) and Proc. Of ISPSD'04, p385, H. Akiyama, et al (Mitsubishi Electric Corporation) (Non-patent Document 1).

FIG. 9A is a diagram showing the circuit construction of a power portion of a motor controlling inverter disclosed in the Patent Document 1. A power device (IGBTs Q1 to Q6 and diodes D1 to D6) used to drive a three-phase motor Mo constitutes a bridge circuit, and has a power module structure accommodated in the same package. A main power source Vcc is normally set to a high voltage of DC 100 to 400V. Particularly, with respect to motor control for a vehicle such as an electric vehicle (EV), a hybrid electric vehicle (HEV) or the like, a main power source Vcc is set to a high voltage of DC 650V. When the high potential side of the main power source Vcc is represented by $V_{CCH}$ and the low potential side of the main power source Vcc is represented by $V_{CCL}$, in order to drive IGBTs Q1 to Q3 connected to $V_{CCH}$, the potential of the gate electrodes of IGBTs is set to a higher potential. Therefore, a photo coupler (PC) or a high voltage IC (HVIC: High Voltage Integrated Circuit) 90 is used for the driving circuit. An input/output terminal (I/O: Input/Output) of the driving circuit is normally connected to a microcomputer, and the overall control of the inverter is carried out by the microcomputer.

FIG. 9B is a block diagram showing the internal constituent unit of the high voltage IC (HVIC) used in FIG. 9A, which is disclosed in the Patent document 1.

The high voltage IC 90 shown in FIG. 9B is constructed by a control circuit (CU: control unit), gate driving circuits GDU (Gate Drive Unit) 4 to 6 with GND potential of low potential as reference potential, gate driving circuits GDU1 to GDU3 with floating potential of high potential as reference potential and a level shift circuit (LSU: Level Shift Unit). The control circuit CU receives/transmits signals from/to the microcomputer through the input/output terminal I/O and generates a control signal for indicating which IGBT of FIG. 9A should be turned on and which IGBT should be turned off. The gate driving circuits GDU (Gate Drive Unit) 4 to 6 drive IGBTs Q4 to Q6 connected to the low potential side $V_{CCL}$ of the main power source Vcc of FIG. 9A. The gate driving circuits GDU1 to DGU3 drive IGBTs Q1 to Q3 connected to the high potential side $V_{CCH}$ of the main power source Vcc of FIG. 9A. The level shift circuit LSU acts to mediate between the signal of the control circuit CU of the $V_{CCL}$ level and the signals of GDU1 to GDU3 (SIN1 to SIN3, SOUT1 to SOUT3) going and returning between the $V_{CCH}$ level and the $V_{CCL}$ level. Accordingly, as described above, the semiconductor device constituting the level shift circuit LSU of the high voltage IC 90 treats the signal between the $V_{CCH}$ level and the $V_{CCL}$ level (0 to 650V), and thus particularly a withstanding voltage (about 1200V) is required.

As in the case of the high voltage IC 90 shown in FIG. 9B, in the semiconductor device in which two or more circuits having different reference potentials are integrated, the forming areas of the respective circuits having the different reference potentials are separated from each other by pn-junction separation or dielectric-material separation using dielectric material such as $SiO_2$ or the like. With respect to the high voltage IC using the pn-junction separation, it is known that a parasitic transistor is easily formed and thus malfunction of the circuit or breakdown of elements may be induced. On the other hand, with respect to the high voltage IC using the dielectric-material separation, no parasitic transistor operation occurs, and thus there does not occur any problem such as malfunction of the circuit and the breakdown of elements.

FIG. 10 is a cross-sectional view showing a conventional high voltage IC 91 using an SOI substrate and trench separation.

In the high voltage IC 91 shown in FIG. 10, an SOI layer 1 of the SOI substrate 10 having an embedded oxide film 3 is provided with a low-potential (GND) reference circuit, a high-potential (float) reference circuit and a level shift circuit. The respective forming areas of the GND reference circuit, the float reference circuit and the level shift circuit are insulation-separated (dielectric-material separation) by the embedded oxide film 3 of the SOI substrate 10 and the side wall oxide film 4s of trenches 4.

In the level shift circuit of the high voltage IC 91, a circuit element having a high withstanding voltage is required to connect the low-potential reference circuit and the high-potential reference circuit to each other. An MOS type transistor $Tr_L$ of the level shift circuit forming area shown in FIG. 10 has a SOI-RESURF structure to secure a withstanding voltage.

As shown in FIG. 10, the high voltage in the level shift circuit is applied to the drain (D) of the MOS type transistor $Tr_L$. In the MOS type transistor $Tr_L$ of FIG. 10, the withstanding voltage in the lateral direction in section is secured by the SOI-RESURF structure including a surface p-type impurity layer and the embedded oxide film 3. With respect to the withstanding voltage in the longitudinal direction in section, a high voltage applied between the drain (D) and the ground (GND) is divided by a low-concentration SOI layer 1 and an embedded oxide film 3 to moderate the electric field in the SOI layer 1 as disclosed in Non-patent Document 1.

As described above, in order to implement a semiconductor device having a high withstanding voltage by using a semiconductor substrate having an SOI structure, it is required to optimally design the concentration and thickness of the SOI layer and the thickness of the embedded oxide film so that a desired withstanding voltage is achieved by distributing an applied voltage in the longitudinal direction in section to the SOI layer and the embedded oxide film.

However, when a high voltage of 1000V or more is achieved according to this method, the embedded oxide film of 5 μm or more in thickness and the SOI layer of 50 μm or more in thickness are needed. On the other hand, the upper limit of the achievable thickness of the embedded oxide film is equal to about 4 μm in consideration of warp, etc. of the SOI substrate. Furthermore, the thickness of the SOI layer is normally equal to several μm to about 20 μm, and as the thickness of the SOI layer is increased, the trench processing load is increased. Therefore, with respect to the MOS type transistor $Tr_L$ in the level shift circuit forming area of FIG. 10, the achievable withstanding voltage is limited to about 600V, and thus it is impossible to secure a withstanding voltage of 1200V which is required in a 400V power supply system, an EV vehicle or the like.

SUMMARY

Therefore, it is an object to provide a semiconductor device that can secure a required withstanding voltage and can be manufactured at a low cost by using a general semiconductor device manufacturing method.

According to a first aspect, a semiconductor device including transistor elements of n (n≧2) that are insulated and separated from one another and successively connected to one another in series between ground (GND) potential and predetermined potential with a transistor element at the GND potential side set as a first stage and a transistor element at the predetermined potential side set as an n-th stage, the gate terminal of the transistor element at the first stage is set as an input terminal, resistance elements or capacitance elements of n are successively connected to one another in series between the GND potential and the predetermined potential with a resistance or capacitance element at the GND potential side set as a first stage and a resistance or capacitance element at the predetermined potential side set as an n-th stage, the gate terminals of the transistor elements at the respective stages excluding the transistor element at the first stage is successively connected to the connection points between the resistance or capacitance elements at the respective stages that are connected to one another in series, and an output is taken from the terminal at the predetermined potential side of the transistor element of the n-th stage.

In the above semiconductor device, by applying an input signal to the gate terminal of the transistor element at the first stage, the transistor elements from the second stage to the n-th stage can be simultaneously operated through resistance elements of n that are connected to one another in series between the GND potential and the predetermined potential.

In the operation of the semiconductor device, a voltage between the GND potential and the predetermined potential is divided by the transistor elements of n, and each of the respective transistor elements from the first stage to the n-th stage takes charge of the corresponding voltage range. Accordingly, as compared with a case where one transistor element takes charge of the voltage between the GND potential and the predetermined potential, the withstanding voltage required to each transistor element is substantially equal to 1/n. Accordingly, even in the case of a transistor element that can be manufactured in low cost by a general manufacturing method and has a normal withstanding voltage, by properly setting the number (n) of transistor elements described above in the semiconductor device, there can be provided a semiconductor device in which a high withstanding voltage required as a whole can be secured.

As described above, the semiconductor device can secure a required withstanding voltage, and it can be manufactured at a low cost by using a general semiconductor device manufacturing method.

According to a second aspect, it is preferable in the above semiconductor device that each of the gate terminals of the transistor elements at the respective stages excluding the transistor element at the first stage is successively connected through a resistance element to the connection point between the resistance or capacitance elements at the respective stages that are connected to each other in series. According to a third aspect, it is preferable that a diode is inserted between the gate terminal and the GND potential side terminal in the transistor elements at the respective stages excluding the transistor element at the first stage.

Accordingly, when an input signal is applied to the gate terminal of the transistor element at the first stage, the simultaneous operation of the transistor elements from the second stage to the n-th stage can be stabilized.

According to a fourth aspect, it is preferable in the above semiconductor device that the transistor elements of n have the same withstanding voltage, and the resistance or capacitance elements of n have the same resistance or capacitance value.

Accordingly, the voltage (withstanding voltage) to be shared by each transistor element inserted between the GND potential and the predetermined potential can be equalized and minimized.

According to a fifth aspect, the transistor elements may be MOS type transistor elements or IGBT elements.

Accordingly to a sixth aspect, the transistor elements of n that are insulated and separated from one another in the semiconductor device are formed in an SOI layer of a semiconductor substrate having an SOI structure having an embedded oxide film, and insulated and separated from one another by insulating and separating trenches extending to the embedded oxide film.

Furthermore, according to a seventh aspect, when the semiconductor substrate having the SOI structure is used, the resistance or capacitance elements of n are also formed in the SOI layer, and insulated and separated from one another by insulating and separating trenches extending to the embedded oxide film.

According to an eighth aspect, it is preferable in the semiconductor device of the sixth aspect that n-multiplexed insulating and separating trenches extending to the embedded oxide film are formed, and the n transistor elements insulated and separated from one another are successively disposed one by one in the respective areas surrounded by the n-multiplexed insulating and separating trenches so that transistor elements at higher stages are located at the inner side.

Furthermore, according to a ninth aspect, it is preferable that the n resistance or capacitance elements insulated and separated from one another by the insulating and separating trenches extending to the embedded oxide film are also successively disposed in the respective areas surrounded by the n-multiplexed insulating and separating trenches one by one so that resistance or capacitance elements at higher stages are located at the inner side.

Accordingly, in accordance with voltage increase from the GND potential to the predetermined potential, the voltage applied to each area surrounded by the n-multiplexed insulating and separating trenches is equalized and the voltage ranges shared to the respective transistor elements of n can be successively shifted from the GND potential to the predetermined potential. Only one of the n-multiplexed insulating and separating trenches exist between adjacent isolated and separated transistor elements, and thus the connection wiring of the n transistor elements can be easily performed, and the occupation area can be reduced, so that the semiconductor device can be miniaturized.

According to a tenth aspect, in the semiconductor device of the sixth aspect, (n−1)-multiplexed insulating and separating trenches extending to the embedded oxide film are formed, and the n transistor elements insulated and separated from one another are successively disposed one by one in the respective areas sectioned by the (n−1)-multiplexed insulating and separating trenches so that transistor elements at higher stages are located at the inner side.

According to an eleventh aspect, the n resistance or capacitance elements insulated and separated from one another by insulating and separating trenches extending to the embedded oxide film are also successively disposed one by one in the respective areas sectioned by the (n−1)-multiplexed insulating and separating trenches so that resistance or capacitance elements at higher stages are located at the inner side.

In this case, as in the case of the semiconductor devices of the eighth and ninth aspects, voltages applied to the respective areas sectioned by the (n−1)-multiplexed insulating and separating trenches in accordance with voltage increase from the GND potential to the predetermined potential can be equalized to one another, and the voltage ranges shared by the n transistor elements can be successively shifted from the GND potential to the predetermined potential. As compared with the semiconductor devices of the eight and ninth aspects, the number of the insulating and separating trenches can be reduced by one, and thus the occupation area can be reduced, so that the semiconductor device can be miniaturized.

In the semiconductor devices of the sixth to eleventh aspects, the n transistor elements may be transistor elements each having a normal withstanding voltage. Furthermore, it is unnecessary that the impurity concentration of the SOI layer is particularly reduced to increase the withstanding voltage.

Therefore, according to a twelfth aspect, it is preferable that a high concentration impurity layer that has the same conductivity type as the SOI layer and a high impurity concentration is formed on the embedded oxide film in the SOI layer.

Accordingly, even when a voltage noise sharply varying around the semiconductor device occurs, a depletion layer can be prevented from spreading from the embedded oxide film. Accordingly, malfunction caused by the voltage noise or the like can be suppressed in the semiconductor device.

According to a thirteenth aspect, it is preferable that when the predetermined potential is a positive potential, the SOI layer is an n-conductivity type.

Likewise, according to a fourteenth aspect, the n transistor elements insulated and separated from one another in the semiconductor device are formed in respective areas in an SOI layer of a semiconductor substrate of an SOI structure having an embedded oxide film comprising an oxide film at the bottom portion and an oxide film in the thickness direction so as to be continuous with the oxide film at the bottom portion, the respective areas being insulated and separated from one another and sectioned by the embedded oxide film.

According to a fifteenth aspect, when the semiconductor substrate having the SOI structure is used, the n resistance or capacitance elements may be formed in the respective areas sectioned by the embedded oxide film and insulated and separated from one another in the SOI layer of the SOI structure semiconductor substrate having the embedded oxide film.

According to a sixteenth aspect, it is preferable in the semiconductor device of the fourteenth aspect that n-multiplexed sectional areas are formed by the embedded oxide film, and the n transistor elements insulated and separated from one another are successively disposed in the n-multiplexed sectional areas one by one so that transistor elements at high stages are located at the inner side.

Furthermore, according to a seventeenth aspect, it is preferable that the n resistance or capacitance elements formed in the respective areas that are sectioned by the embedded oxide film and insulated and separated from one another are successively disposed in the n-multiplexed sectional areas one by one so that resistance or capacitance elements at higher stages are located at the inner side.

According to an eighteenth aspect, it is preferable in the semiconductor devices of the fourteenth to seventeenth aspects that a high concentration impurity layer that has the same conductivity type as the SOI layer and a high impurity concentration is formed on the embedded oxide film in the SOI layer. Furthermore, according to a nineteenth aspect, it is preferable that when the predetermined potential is a positive potential, the SOI layer is an n-conductivity type.

The effect achieved by the semiconductor devices of the fourteenth to nineteenth aspects are the same as the semiconductor devices of the sixth to thirteenth aspects, and the description thereof is omitted.

According to a twentieth aspect, the semiconductor device is suitable for the level shift circuit in the inverter driving high voltage IC comprising a GND reference gate driving circuit having GND potential as reference potential, a float reference gate driving circuit having float potential as reference potential, a control circuit for controlling the GND reference gate driving circuit and the float reference gate driving circuit, and a level shift circuit that is interposed between the control circuit and the float reference gate driving circuit and level-shifts the input/output signal of the control circuit between the GND potential and the float potential. In this case, the predetermined potential is the float potential.

According to a twenty first aspect, the high voltage IC may be an inverter driving high voltage IC for an in-vehicle mount type motor, or according to a twenty second aspect, the high voltage IC may be an inverter driving high voltage IC for an in-vehicle mount type air conditioner.

BRIEF DESCRIPTION OF THE DRAWINGS

The above and other objects, features and advantages will become more apparent from the following detailed description made with reference to the accompanying drawings:

FIGS. 7A and 7B show another semiconductor device 101a, wherein FIG. 7A is a schematic top view of the semiconductor device 101a, and FIG. 7B is a cross-sectional view along line VIIB-VIIB;

DETAILED DESCRIPTION OF THE PREFERRED EMBODIMENTS

Preferred embodiments according will be described with reference to the accompanying drawings.

Figure 1:
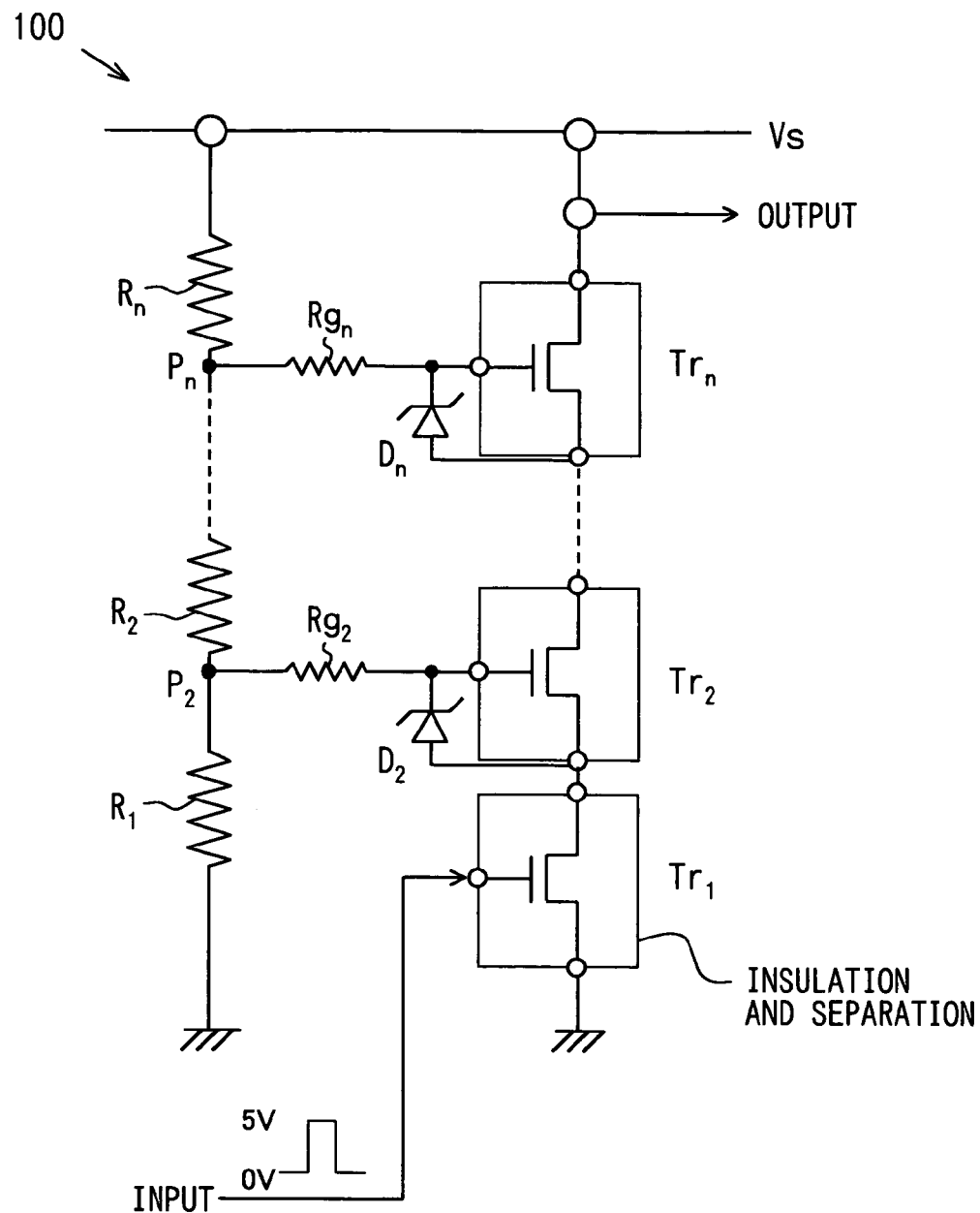
FIG. 1 is a basic equivalent circuit diagram of a semiconductor device according to an embodiment.

FIG. 1 is a basic equivalent circuit diagram of a semiconductor device 100.

In the semiconductor device 100 of FIG. 1, transistor elements Tr1 to Trn of n (n≧2) which are insulated and separated from one another are successively connected to one another in series between ground (GND) potential and predetermined potential Vs while the GND potential side is set to a first stage and the predetermined potential Vs side is set to an n-th stage. The n transistor elements Tr1 to Trn may be MOS (Metal Oxide Semiconductor) type transistor elements or IGBT (Insulated Gate Bipolar Transistor) elements. When each of the transistor elements Tr1 to Trn is an MOS type transistor element, in the above construction, a drain voltage of an MOS type transistor element at a lower stage is applied to the source of the MOS type transistor element at the upper stage thereof.

Furthermore, resistance elements R1 to Rn of n are successively connected to one another in series between the GND potential and the predetermined potential Vs while the GND potential side is set to a first stage and the predetermined potential Vs side is set to an n-th stage. Weak current flows into the n resistance elements R1 to Rn to divide and share the voltage between GND potential and the predetermined potential Vs to the respective resistance elements R1 to Rn. In FIG. 1, the voltage between the GND potential and the predetermined potential Vs is divided by the respective resistance elements R1 to Rn, however, the voltage concerned may be divided by capacitance elements. In this case, an effect of reducing consumption current can be achieved.

The gate terminals of the transistor elements Tr2 to Trn at the respective stages excluding the transistor element Tr1 at the first stage are successively connected to the respective connection points P2 to Pn between the resistance elements R1 to Rn at the respective stages which are connected to one another in series.

In the semiconductor device 100 of FIG. 1, the gate terminals of the transistor elements Tr2 to Trn at the respective stages excluding the transistor element Tr1 at the first stage are successively connected through resistance elements Rg2 to Rgn to the respective connection points P2 to Pn between the resistance elements R1 to Rn at the respective stages which are connected to one another in series. Likewise, each of diodes D2 to Dn is inserted between the gate terminal and the terminal at the GND potential side of each of the transistor elements Tr2 to Trn in the transistor elements Tr2 to Trn at the respective stages excluding the transistor element Tr1 at the first stage. As described later, when an input signal is applied to the gate terminal of the transistor element Tr1 at the first stage, the simultaneous operation of the transistor elements Tr2 to Trn from the second stage to the n-th stage can be stabilized by the resistance elements Rg2 to Rgn and the diodes D2 to Dn.

The gate terminal of the transistor element Tr1 at the first stage serves as an input terminal of the semiconductor device 100. The output of the semiconductor device 100 is taken out from the terminal at the predetermined potential Vs side of the transistor element Trn at the n-th stage through a load resistance (not shown) having a predetermined resistance value. The reference potential of the output signal is converted from the GND potential of the input signal to the predetermined potential Vs (level shift), and thus it is taken out while inverted to the input signal.

In the semiconductor device 100 of FIG. 1, by applying an input signal to the gate terminal of the transistor element Tr1 at the first stage, the transistor elements Tr2 to Trn from the second stage to the n-th stage can be simultaneously operated through the n resistance elements R1 to Rn connected to one another in series between the GND potential and the predetermined potential Vs. That is, in a case where each of the transistor elements Tr1 to Trn is an MOS type transistor element and the ground potential side of each of the transistor elements Tr1 to Trn is set to the source, the drain potential of the transistor element Tr1 at the first stage is lowered when a signal voltage is applied to the gate terminal of the transistor element Tr1 at the first stage. In connection with the reduction in the drain potential, the source potential of the transistor element Tr2 at the second stage is lowered, so that current flows from the connection point P2 into the diode D2 between the gate and source of the transistor element Tr2 at the second stage. The gate and the source are fixed to a zener voltage (5V in this case), so that the transistor element Tr2 at the second stage is turned on. The same operation as described above is repeated until the transistor element Trn at the n-th stage, and all the transistor elements Tr1 to Trn are turned on in extremely short time.

In the operation of the semiconductor device of FIG. 1, the voltage between the GND potential and the predetermined potential is divided by the n transistor elements Tr1 to Trn and the respective transistor elements Tr1 to Trn from the first stage to the n-th stage take charge of the respective divided voltage ranges. Accordingly, as compared with a case where one transistor element takes charge of the voltage between the GND potential and the predetermined potential Vs, the withstanding voltage required to each of the transistor elements Tr1 to Trn is substantially equal to 1/n. Accordingly, by properly setting the number n of transistor elements in the semiconductor device 100 of FIG. 1, a high withstanding voltage required as a whole can be secured in the semiconductor device even when the transistor elements can be manufactured at a low cost by a general manufacturing method and have a normal withstanding voltage. In the semiconductor device 100 of FIG. 1, it is preferable that the n transistor elements Tr1 to Trn have the same withstanding voltage, and the n resistance elements R1 to Rn have the same resistance value. Accordingly, the voltages (withstanding voltages) shared by the transistor elements Tr1 to Trn inserted between the GND potential and the predetermined potential can be equalized and minimized.

Specifically, for example, an MOS type transistor element having a withstanding voltage of about 150V can be easily formed by using a general SOI substrate having an embedded oxide film of about 2 μm in thickness according to a general manufacturing method. Accordingly, the n transistor elements Tr1 to Trn which are insulated and separated from one another by the insulating and separating trenches are formed in the SOI substrate to form a semiconductor device 100 comprising the transistor elements of n stages connected to one another in series, thereby implementing the semiconductor device having a high withstanding voltage. For example, by connecting transistor elements having a withstanding voltage of 150V in series at two stages, four stages or eight stages as shown in FIG. 1, a semiconductor device 100 having a withstanding voltage of 300V, 600V or 1200V can be achieved. Accordingly, it is unnecessary to change the wafer structure (the thickness of the SOI layer, the embedded oxide film, the impurity concentration of the SOI layer) in accordance with the withstanding voltage. Furthermore, the processing depth of the insulating and separating trenches is fixed, and thus the semiconductor device can be easily implemented even when the required withstanding voltage is equal to 1000V or more.

As described above, the semiconductor device 100 shown in FIG. 1 can secure a required withstanding voltage, and it can be manufactured in low cost by using a general semiconductor device manufacturing method.

Next, a more specific application of the semiconductor device 100 of FIG. 1 will be described.

Figure 2:
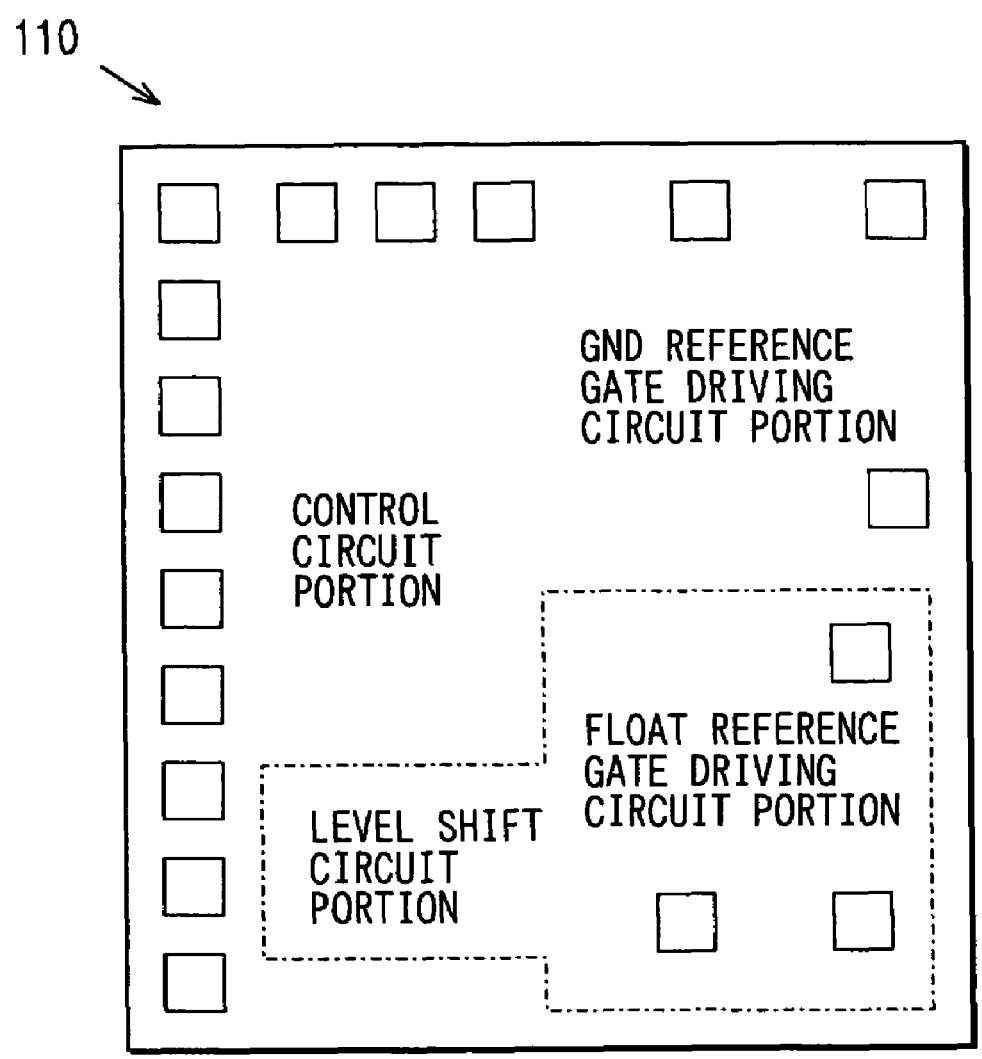
FIG. 2 is a schematic plan view showing a high voltage IC to which the semiconductor device shown in the basic equivalent circuit diagram of FIG. 1 is applied.

FIG. 2 is a plan view showing a high voltage IC 110 to which the semiconductor device 100 shown in the basic equivalent circuit diagram of FIG. 1 is applied.

Figure 9A:
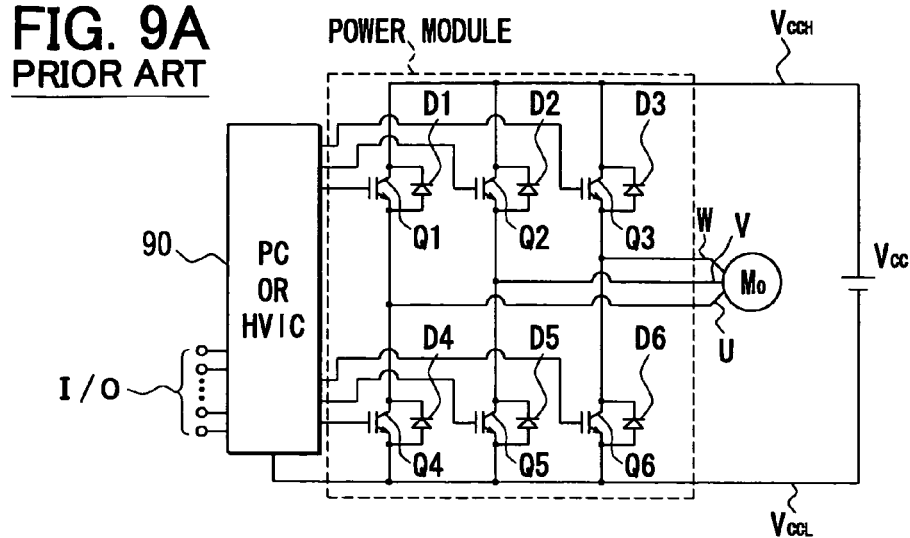
FIG. 9A is a diagram showing the circuit construction of a power portion of a motor controlling inverter disclosed in Patent Document 1.
Figure 9B:
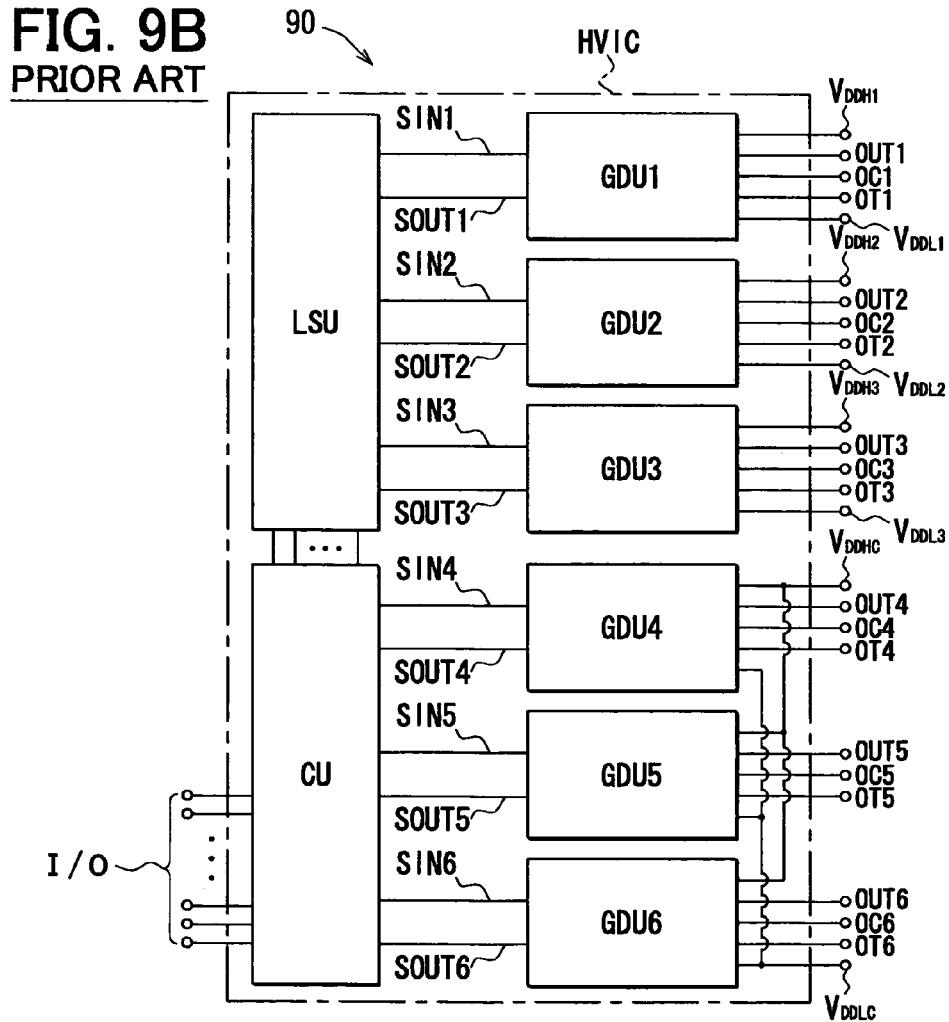
FIG. 9B is a block diagram showing an internal construction unit of a high voltage IC (HVIC) used in FIG. 9A.

The high voltage IC 110 of FIG. 2 is an inverter driving high voltage IC similar to the high voltage IC described with reference to FIG. 9, and it comprises a GND reference gate driving circuit having GND potential as reference potential, a float reference gate driving circuit having float potential as reference potential, a control circuit for controlling the GND reference gate driving circuit and the float reference gate driving circuit, and a level shift circuit that is interposed between the control circuit and the float reference gate driving circuit and level-shifts the input/output signal of the control circuit between the GND potential and the float potential. The semiconductor device 100 shown in FIG. 1 is applied to the level shift circuit of the high voltage IC 110 of FIG. 2. In this case, the predetermined potential Vs of FIG. 1 is set to a positive float potential of about 1200V.

Figure 3:
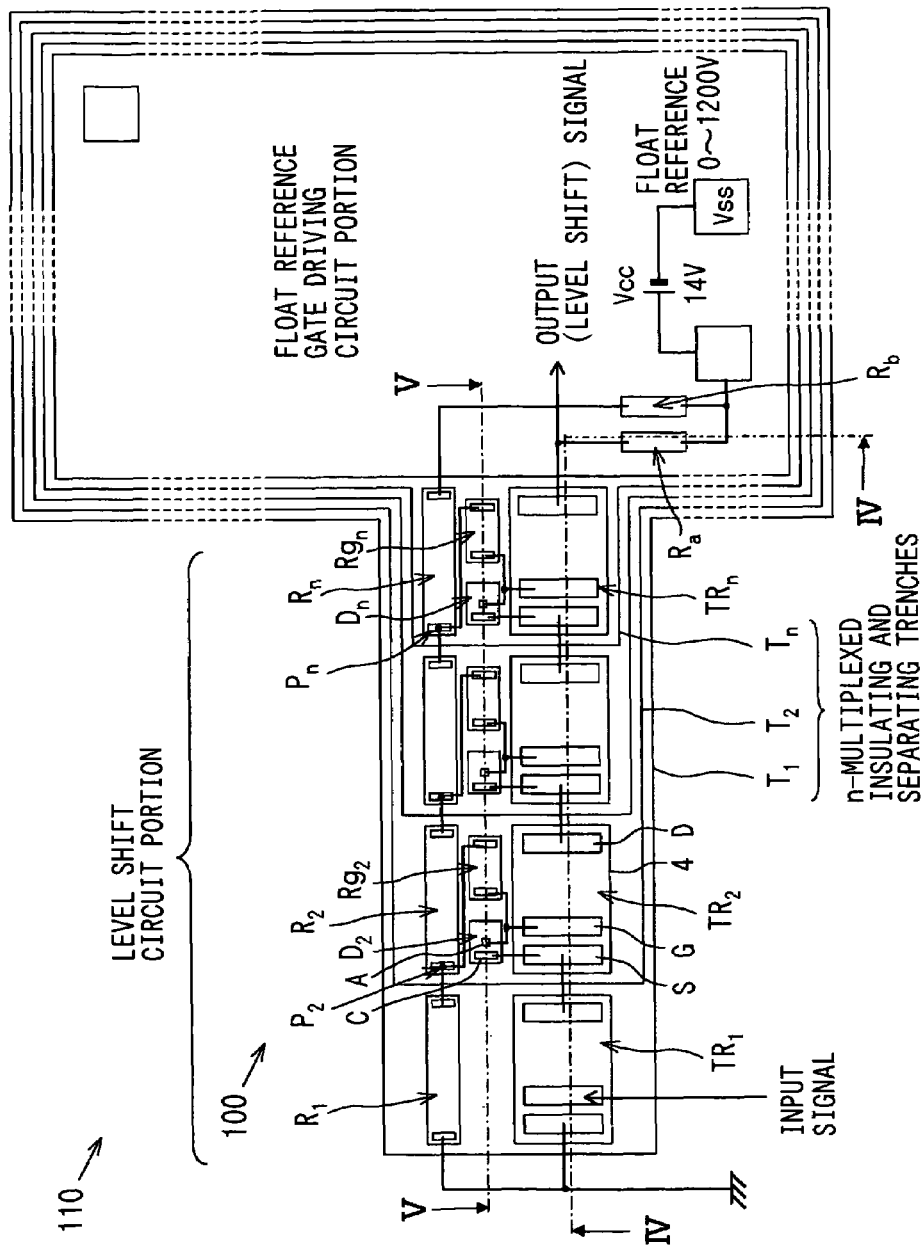
FIG. 3 is a diagrams showing the details of a level shift circuit portion and a float reference gate driving circuit portion surrounded by a one-dotted chain line in the high voltage IC of FIG. 2.
Figure 4:
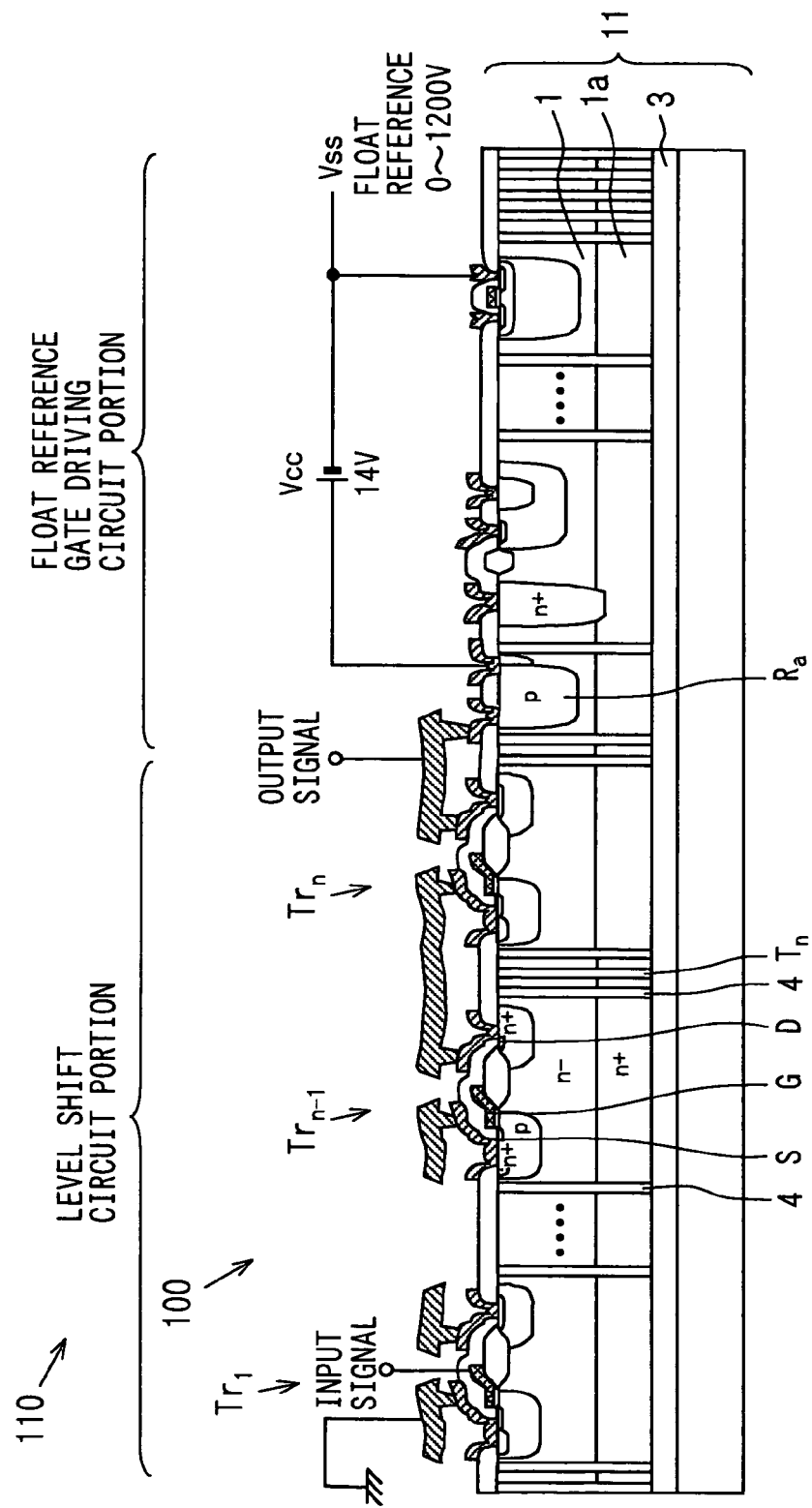
FIG. 4 is a cross-sectional view of along line IV-IV of FIG. 3.
Figure 5:
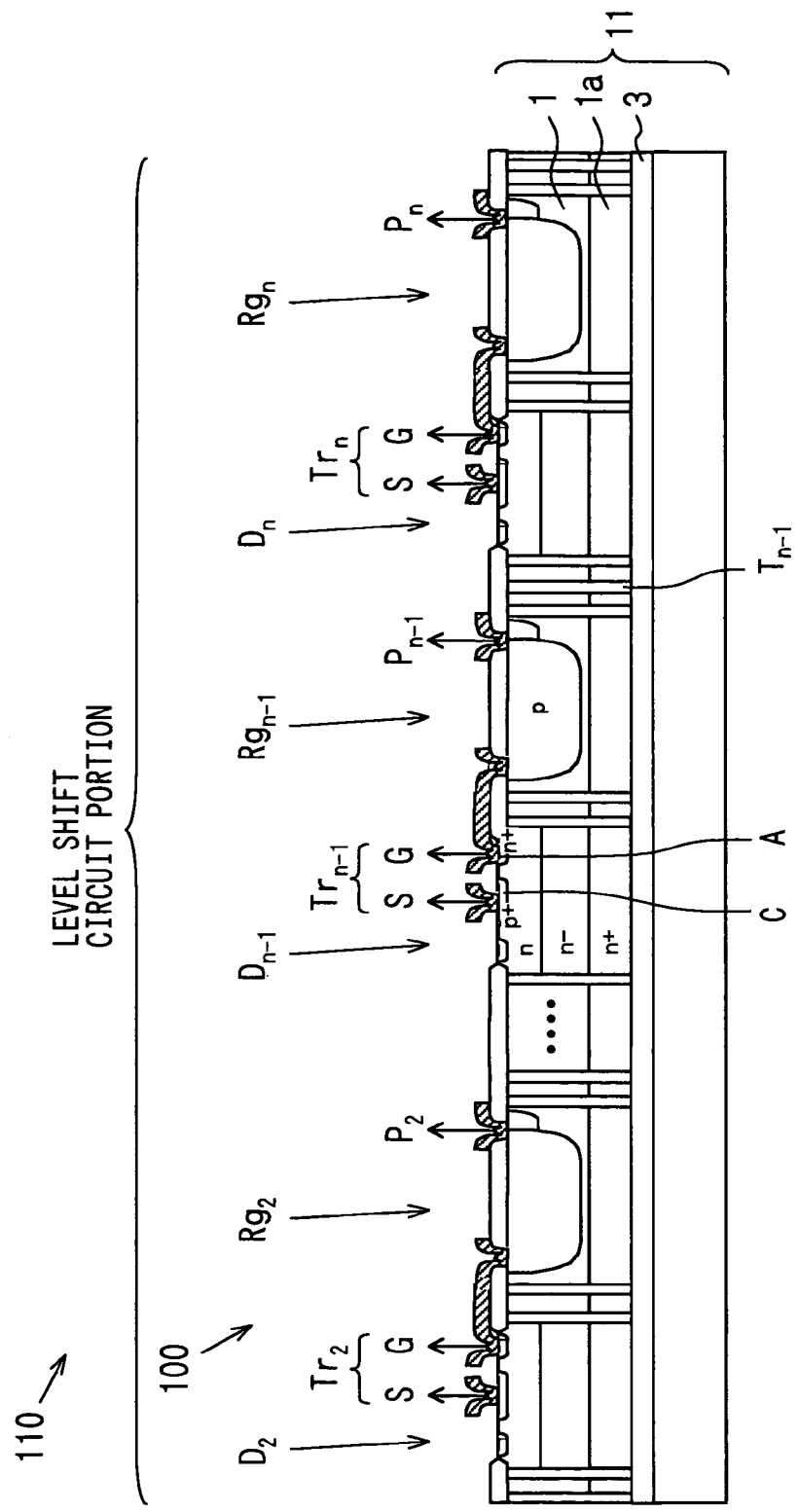
FIG. 5 is a cross-sectional view of along line V-V of FIG. 3.

FIG. 3 is a diagram showing the details of the level shift circuit portion and the float reference gate driving circuit portion surrounded by a one-dotted chain line in the high voltage IC 110 of FIG. 2, and also it shows the arrangement of the respective circuit elements of the semiconductor device 100 of FIG. 1 which is applied to the level shift circuit. FIG. 4 is a cross-sectional view of one-dotted chain line IV-IV of FIG. 3, and it shows the structure of each transistor element. FIG. 5 is a cross-sectional view taken along one-dotted chain line V-V of FIG. 3, and it shows the structure of resistance elements connected to the diodes and the gates of the transistor elements.

As shown in the cross-sectional view of FIG. 4, in the high voltage IC 110, the transistor elements Tr1 to Trn of n in the semiconductor device 100 of FIG. 1 applied to the level shift circuit are formed in the n-conductivity type SOI layer 1 of the SOI structure semiconductor substrate 11 having the embedded oxide film 3. The transistor elements Tr1 to Trn of n are LDMOS (Lateral Double-diffused MOS) type transistor elements, and insulated and separated from one another by the insulating and separating trenches 4 extending to the embedded oxide film 3.

As shown in the cross-sectional view of FIG. 5, p-conductivity type diffused resistors are used as resistance elements Rg2 to Rgn in the high voltage IC 110. With respect to the resistance elements Rg2 to Rgn, the SOI layer 1 is fixed to the same potential at the high potential side in order to suppress the effect of the potential. When the n-conductivity type diffused resistors are used, it is required to fix the SOI layer 1 to the same potential at the low potential side. In place of the diffused resistors, bulk resistors having high resistance or thin film polysilicon resistors may be used as the resistance elements Rg2 to Rgn and the resistance elements R1 to Rn.

Furthermore, in the semiconductor device 100 of the high voltage IC 110, as shown in FIG. 3, the n-multiplexed insulating and separating trenches T1 to Tn extending to the embedded oxide film 3 are formed, and the n transistor elements Tr1 to Trn insulated and separated from one another are successively disposed one by one in the respective areas surrounded by the n-multiplexed insulating and separating trenches T1 to Tn so that transistor elements at high stages are located at the inner side. Likewise, the n resistance elements R1 to Rn, the (n−1) resistance elements Rg2 to Rgn and the (n−1) diodes D2 to Dn which are insulated and separated from one another by the insulating and separating trenches extending to the embedded oxide film 3 are successively disposed one by one in the respective areas surrounded by the n-multiplexed insulating and separating trenches T1 to Tn so that resistance elements at high stages are located at the inner side. Accordingly, the voltages applied to the respective areas surrounded by the n-multiplexed insulating and separating trenches T1 to Tn in accordance with voltage increase from the GND potential to the predetermined potential are equalized to one another, and the voltage ranges shared by the n transistor elements Tr1 to Trn can be successively shifted from the GND potential to the predetermined potential. Only one of the n-multiplexed insulating and separating trenches T1 to Tn exists between the neighboring transistor elements, and thus the connection wiring of the n transistor elements Tr1 to Trn can be easily performed and the occupation area can be reduced, so that the semiconductor device 100 can be miniaturized.

Figure 10:
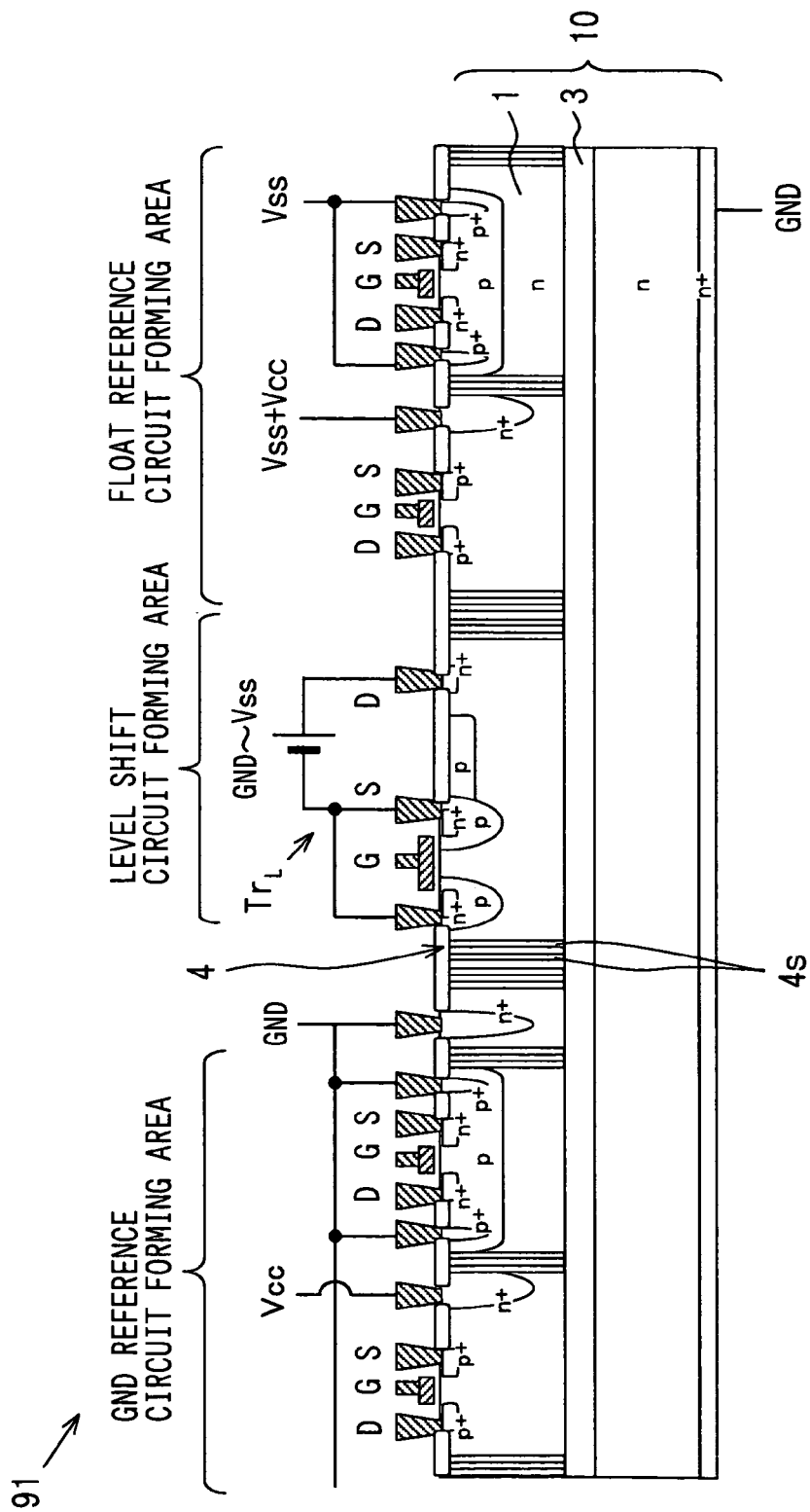
FIG. 10 is a schematic cross-sectional view showing a conventional high voltage IC using an SOI substrate and trench separation.

As described above, in the semiconductor device 100, the n transistor elements Tr1 to Trn may be transistor elements each having a normal withstanding voltage. Furthermore, it is unnecessary that the impurity concentration of the SOI layer 1 is reduced to increase the withstanding voltage. Therefore, as shown in FIGS. 4 and 5, a high concentration impurity layer 1a that is the same conductivity type as the SOI layer 1 and has a high impurity concentration can be formed on the embedded oxide film 3 in the SOI layer 1 unlike the high voltage IC 91 of FIG. 10. Accordingly, even when a voltage noise varying sharply around the semiconductor device 100 occurs, a depletion layer can be suppressed from spreading from the embedded oxide film 3. Accordingly, malfunction caused by the voltage noise or the like can be suppressed in the semiconductor device. For example, the effect of high frequency potential interference caused by dV/dt variation occurring in connection with the switching operation of the float reference gate driving circuit at the output stage can be shielded.

As described above, the high voltage IC 110 shown in FIGS. 2 to 5 can secure a withstanding voltage of 1200V, and can be suitable for inverter driving of an in-vehicle mount motor or in-vehicle mount air conditioner. Furthermore, this embodiment is not limited to the above technical field, but it may be applied to consumer-use/industrial motor control fields.

OTHER EMBODIMENTS

Figure 6:
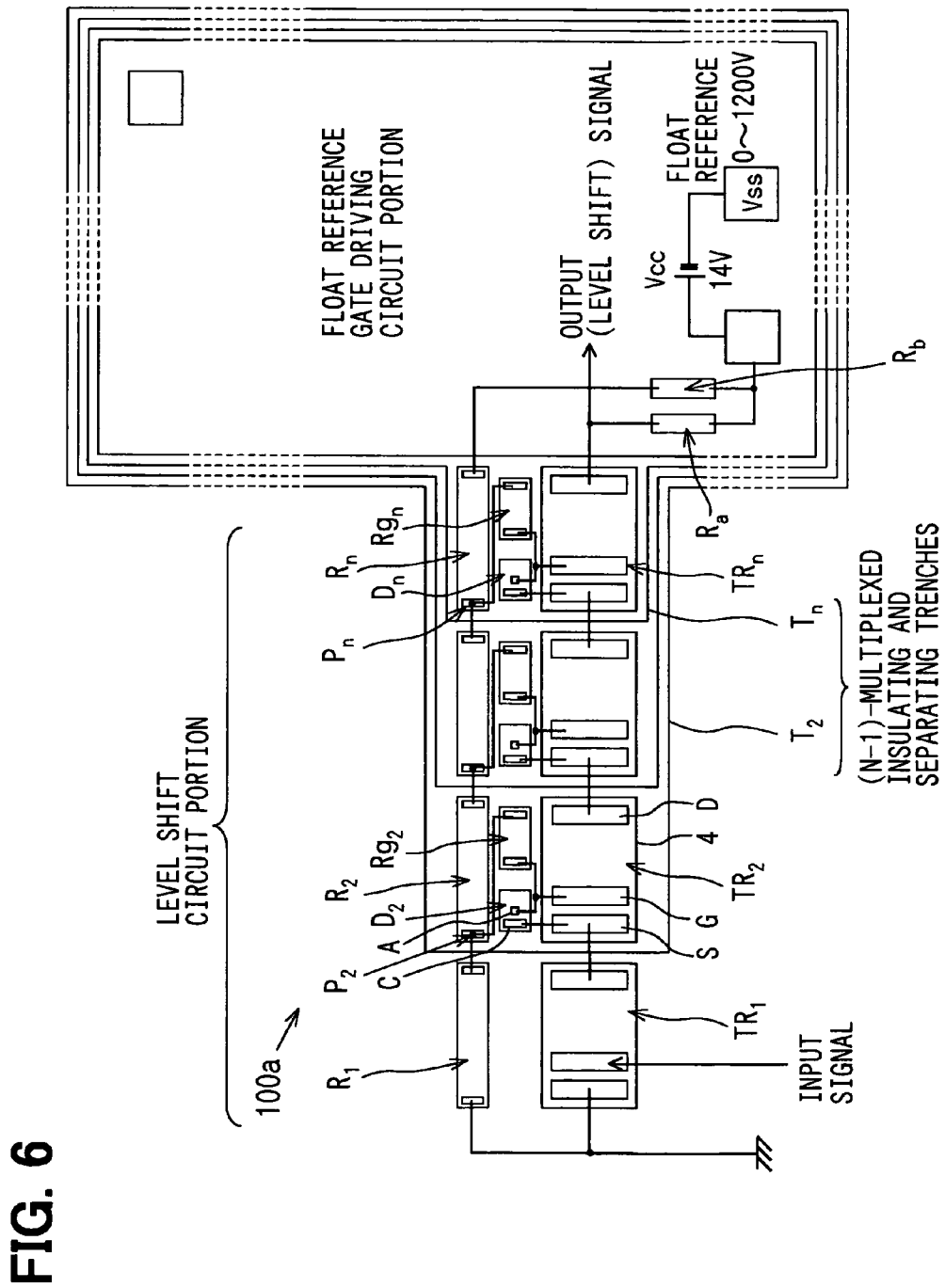
FIG. 6 is a diagram showing respective circuit elements of another semiconductor device to which the level shift circuit is applied, and the arrangement of the circuit elements.

FIG. 6 is a diagram showing the respective circuit elements of another semiconductor device 100a applied to the shift level circuit and the arrangement of the circuit elements.

The semiconductor device 100a shown in FIG. 6 is designed so that the insulating and separating trench T1 on the outermost periphery of the n-multiplexed insulating and separating trenches T1 to Tn of the semiconductor device 100 shown in FIG. 3 is removed, and the other circuit elements and the arrangement thereof are the same as the semiconductor device 100 of FIG. 3. That is, in the semiconductor device 100a of FIG. 6, (n–1)-multiplexed insulating and separating trenches T2 to Tn extending to the embedded oxide film 3 are formed and the n transistor elements Tr1 to Trn insulated and separated from one another are successively disposed one by one in the respective areas sectioned by the (n–1)-multiplexed insulating and separating trenches T2 to Tn so that transistor elements at higher stages are located at the inner side. Likewise, the n resistance elements R1 to Rn insulated and separated from one another by the insulating and separating trenches extending to the embedded oxide film 3 are successively disposed one by one in the respective areas sectioned by the (n–1)-multiplexed insulating and separating trenches T2 to Tn so that resistance elements at higher stages are located at the inner side.

As in the case of the semiconductor device 100 shown in FIG. 3, in the semiconductor device 100a shown in FIG. 6, the voltages applied to the respective areas sectioned by the (n–1)-multiplexed insulating and separating trenches T2 to Tn in accordance with voltage increase from the GND potential to the predetermined potential are equalized to one another, and the voltage ranges shared by the n transistor elements Tr1 to Trn can be successively shifted from the GND potential to the predetermined potential. Furthermore, as compared with the semiconductor device 100 shown in FIG. 3, the number of the insulating and separating trenches can be reduced by one, and thus the occupation area can be reduced, so that the semiconductor device 100a can be miniaturized.

In the semiconductor devices 100, 100a shown in FIGS. 3 to 5 and FIG. 6, the SOI structure semiconductor substrate 11 having the embedded oxide film 3 is used, and the respective elements are insulated and separated by the insulating and separating trenches 4, T1 to Tn extending to the embedded oxide film 3. The insulating and separating trenches 4, T1 to Tn are generally formed by bonding silicon (Si) wafers through embedded oxide film 3, forming a thin SOI layer 1 through polishing, forming trenches extending to the embedded oxide film 3 and then embedding the trenches. However, the semiconductor device may be manufactured by other methods beside the method described above, and a different SOI structure semiconductor substrate and a different insulating and separating method may be adopted.

Figure 7A:
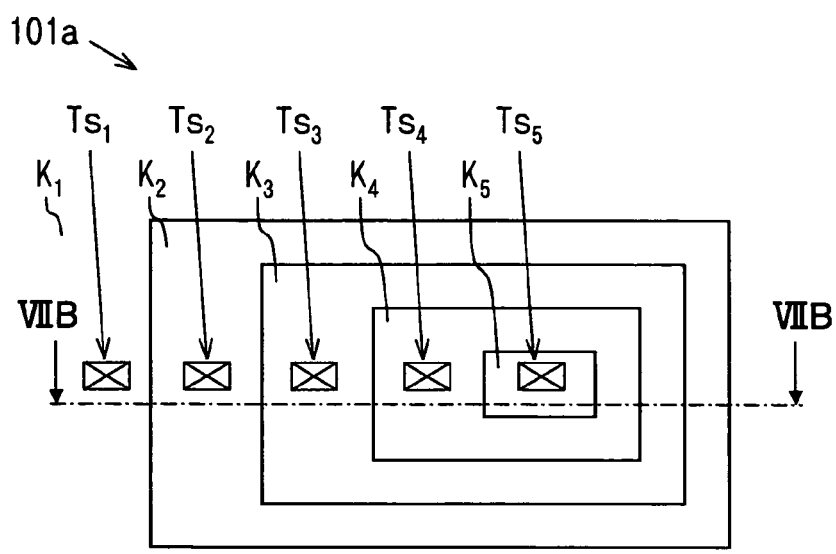
Figure 7B:
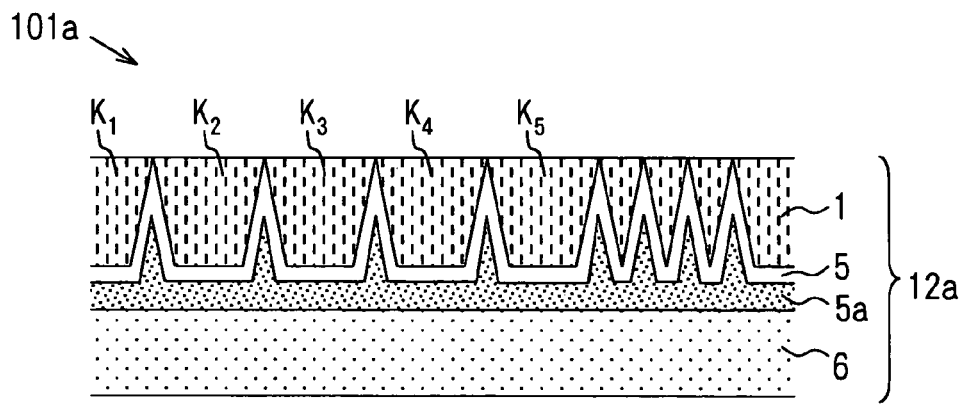

FIGS. 7A and 7B are diagrams showing another semiconductor device 101a. FIG. 7A is a schematic top view showing the semiconductor device 101a, and FIG. 7B is a cross-sectional view taken along one-dotted chain line VIIB-VIIB of FIG. 7A. In FIG. 7A, transistor elements Ts1 to Ts5 at respective stages are illustrated as being simplified in order to simplify the description. The resistance elements, etc. at the respective stages are omitted from the illustration.

In the semiconductor device 101a shown in FIGS. 7A and 7B, the SOI layer 1 of the SOI structure semiconductor substrate 12a is sectioned by an embedded oxide film 5 comprising an oxide film at the bottom portion and an oxide film formed in the thickness direction so as to be continuous with the oxide film at the bottom portion (hereinafter referred to as "embedded oxide film 5"), thereby forming quintet sectional areas K1 to K5. The insulating and separating method of the semiconductor device 101a described above is called as an EPIC (Epitaxial Passivated Integration Circuit) method, and it is a conventional dielectric material separating method ("Power Device/Power IC Handbook" in 1996, edited by High-performance and High-function Power Device/Power IC Research Expert Committee of Institute of Electrical Engineers).

The insulation and separation structure shown in FIG. 7B is formed as follows. That is, before the silicon wafers are bonded to each other, V-shaped grooves are formed in one silicon (Si) wafer which will serve as the SOI layer 1, and the surface of the silicon wafer is oxidized (the embedded oxide film 5 is formed). Thereafter, polysilicon 5a containing no impurities is deposited and embedded in the V grooves. Subsequently, the polysilicon 5a is polished to flatten the surface thereof, the silicon wafer is bonded to the support substrate 6, and then polishing is carried out until the tip of the embedded oxide film 5 is exposed from the opposite side, whereby the insulation and separation structure shown in FIG. 7B is completed. By diffusing impurities before the surface is oxidized (the embedded oxide film 5 is formed), a high concentration impurity layer which is the same conductivity type as the SOI layer 1 and has a high impurity concentration can be formed on the embedded oxide film 5 in the SOI layer 1 as in the case of FIGS. 4 and 5.

As shown in FIG. 7A, the five transistor elements Ts1 to Ts5 insulated and separated from one another are successively disposed one by one in the quintet-multiplexed sectional areas K1 to K5 so that transistor elements, etc. at higher stages are located at the inner side as in the case of the semiconductor device 100a of FIG. 6. The insulation and separation structure shown in FIG. 7B is used for the insulation and separation of the transistor elements Ts1 to Ts5. With respect to the resistance elements at the respective stages which are insulated and separated from one another (not shown), they are successively disposed one by one in the quintet-multiplexed sectional areas K1 to K5 so that resistance elements, etc. at higher stages are located at the inner side. Accordingly, in the semiconductor device 101a shown in FIGS. 7A and 7B, any required withstanding voltage can be secured and the semiconductor device can be manufactured at a low cost by using a general semiconductor device manufacturing method as in the case of the semiconductor devices 100, 100a shown in FIGS. 3 to 5 and FIG. 6.

Figure 8A:
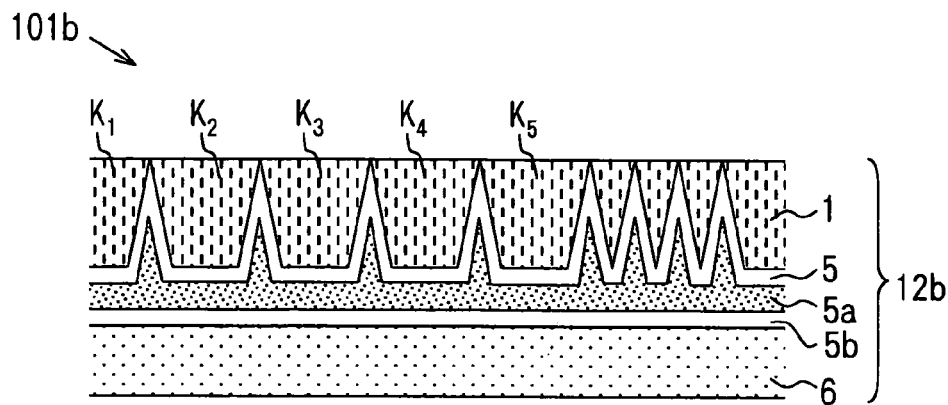
FIGS. 8A to 8C are schematic cross-sectional views of modifications of the semiconductor device of FIGS. 7A and 7B.
Figure 8B:
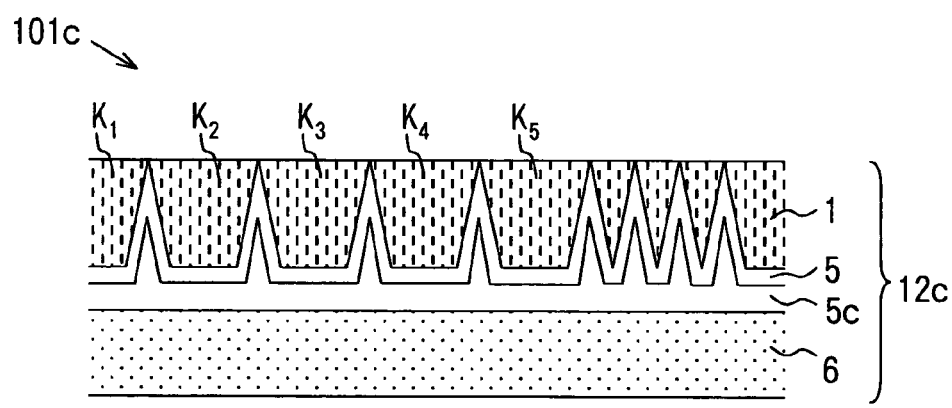
Figure 8C:
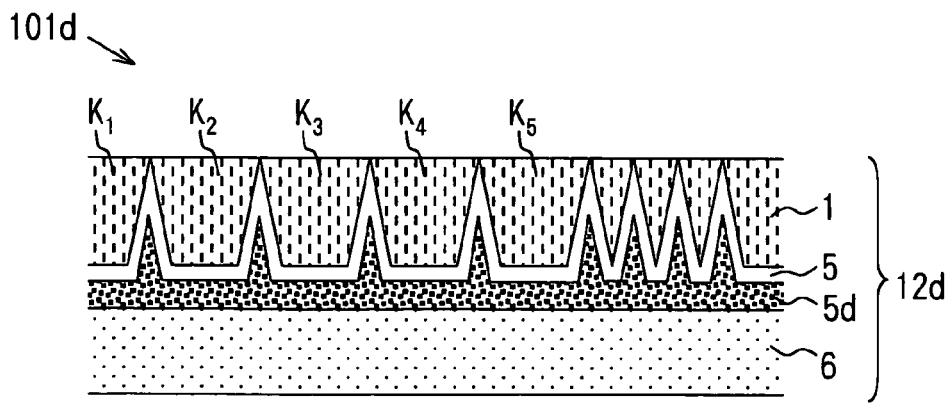

FIGS. 8A to 8C show modifications of the semiconductor device 101a of FIGS. 7A and 7B, and are schematic cross-sectional views of semiconductor devices 101b to 101d. In the semiconductor devices 101b to 101d of FIGS. 8A to 8C, the same elements as the semiconductor device 101a of FIGS. 7A and 7B are represented by the same reference numerals. The top views of the semiconductor devices 101b to 101d are the same as FIG. 7A.

In the SOI structure semiconductor substrate 12b used for the semiconductor device 101b of FIG. 8A, the oxide film 5b formed by oxidizing the surface of polysilicon 5a before the bonding is added to the SOI structure semiconductor substrate 12a shown in FIG. 7B. Accordingly, the insulation and separation of the SOI layer 1 and the support substrate 6 are surely performed, and the potential at the support substrate 6 side can be surely floated in the semiconductor device 101b of FIG. 8A.

In the SOI structure semiconductor substrate 12c used for the semiconductor device 101c of FIG. 8B, silicon oxide film 5c is deposited by CVD in place of polysilicon 5a to embed the V grooves with the silicon oxide film 5c. Accordingly, the insulation and separation of the SOI layer 1 and the support substrate 6 can be also surely performed, and the potential at the support substrate 6 side can be surely floated in the semiconductor device 101c of FIG. 8B.

In the SOI structure semiconductor substrate 12d used for the semiconductor device 101d of FIG. 8C, the embedded oxide film 5 is designed to have a predetermined film thickness (for example, 3 μm or more for the withstanding voltage of 1200V), and polysilicon 5d doped with impurities is deposited and embedded in the V grooves unlike the semiconductor device 101a of FIG. 7B. The structure of the semiconductor device 101d of FIG. 8C is effective to a case where the potential at the support substrate 6 side is fixed to GND and used.

The semiconductor device 100 shown in FIGS. 2 to 5 is the semiconductor device using the SOI structure semiconductor substrate 11 in which the SOI layer 1 is the n-conductivity type. However, the semiconductor device is not limited to this semiconductor device, and it may be a semiconductor device using an SOI structure semiconductor substrate in which the SOI layer 1 is p-conductivity type. In this case, the conductivity types of the respective figures of the above-described embodiments are inverted.

In the semiconductor devices 100 shown in FIGS. 2 to 8, insulating film formed of oxide film is used as the embedded oxide films 3 and 5. In place of the oxide film, any material such as nitride film such as $Si_3N_4$ or the like, insulating carbide film or the composite film thereof may be used insofar as it is insulating film.

Furthermore, The semiconductor device 100 shown in FIGS. 2 to 5 is applied to the level shift circuit of the inverter driving high voltage IC comprising the GND reference gate driving circuit, the float reference gate driving circuit, the control circuit and the level shift circuit. However, the semiconductor device is not limited to this semiconductor device, and it may be applied to any semiconductor device needing a high withstanding voltage to which level shift between ground (GND) potential and predetermined potential is required.

What is claimed is:

1. A semiconductor device comprising:
a number n of (n≧2) transistor elements that are insulated and separated from one another and successively connected to one another in series between ground potential and a predetermined potential, wherein a transistor element at the GND potential side is set as a first stage and a transistor element at the predetermined potential side is set as an n-th stage, wherein a gate terminal of the transistor element at the first stage is set as an input terminal; and
a number n of resistance elements or capacitance elements successively connected to one another in series between the GND potential and the predetermined potential, wherein a resistance or capacitance element at the GND potential side is set as a first stage and a resistance or capacitance element at the predetermined potential side is set as an n-th stage, wherein gate terminals of the transistor elements at the respective stages excluding the transistor element at the first stage are successively connected to connection points between the resistance or capacitance elements at the respective stages that are connected to one another in series, wherein an output is taken from the terminal at the predetermined potential side of the transistor element of the n-th stage.

2. The semiconductor device according to claim 1, wherein the gate terminals of the transistor elements at the respective stages excluding the transistor element at the first stage are successively connected through resistance elements to the connection points between the resistance or capacitance elements at the respective stages that are connected to one other in series.

3. The semiconductor device according to claim 1, wherein a diode is inserted between the gate terminal and the GND potential side terminal in each of the transistor elements at the respective stages excluding the transistor element at the first stage.

4. The semiconductor device according to claim 1, wherein each of the transistor elements has the same withstanding voltage, and the resistance or capacitance elements of n have the same resistance or capacitance value.

5. The semiconductor device according to claim 1, wherein the transistor elements are MOS type transistor elements or IGBT elements.

6. The semiconductor device according to claim 1, wherein the transistor elements of n are formed in an SOI layer of a semiconductor substrate having an SOI structure having an embedded oxide film, and are insulated and separated from one another by insulating and separating trenches extending to the embedded oxide film.

7. The semiconductor device according to claim 6, wherein the resistance or capacitance elements are formed in the SOI layer of the SOI structure semiconductor substrate having the embedded oxide film, and are insulated and separated from one another by insulating and separating trenches extending to the embedded oxide film.

8. The semiconductor device according to claim 6, wherein n-multiplexed insulating and separating trenches extending to the embedded oxide film are formed, and the n transistor elements insulated and separated from one another are successively disposed one by one in the respective areas surrounded by the n-multiplexed insulating and separating trenches so that transistor elements at higher stages are located at the inner side.

9. The semiconductor device according to claim 8, wherein the n resistance or capacitance elements are formed in the SOI layer of the SOI structure semiconductor substrate having the embedded oxide film and insulated and separated from one another by insulating and separating trenches extending to the embedded oxide film, the n resistance or capacitance elements insulated and separated from one another are successively disposed in the respective areas surrounded by the n-multiplexed insulating and separating trenches one by one so that resistance or capacitance elements at higher stages are located at the inner side.

10. The semiconductor device according to claim 6, wherein (n−1)-multiplexed insulating and separating trenches extending to the embedded oxide film are formed, and the n transistor elements insulated and separated from one another are successively disposed one by one in the respective areas sectioned by the (n−1)-multiplexed insulating and separating trenches so that transistor elements at higher stages are located at the inner side.

11. The semiconductor device according to claim 10, wherein the n resistance or capacitance elements are formed in the SOI layer of the SOI structure semiconductor substrate having the embedded oxide film and insulated and separated from one another by insulating and separating trenches extending to the embedded oxide film, the n resistance or capacitance elements insulated and separated from one another are successively disposed one by one in the respective areas sectioned by the (n–1)-multiplexed insulating and separating trenches so that resistance or capacitance elements at higher stages are located at the inner side.

12. The semiconductor device according to claim 6, wherein a high concentration impurity layer that has the same conductivity type as the SOI layer and a high impurity concentration is formed on the embedded oxide film in the SOI layer.

13. The semiconductor device according to claim 6, wherein the SOI layer is an n-conductivity type.

14. The semiconductor device according to claim 1, wherein the n transistor elements are formed in respective areas in an SOI layer of a semiconductor substrate of an SOI structure having an embedded oxide film comprising an oxide film at the bottom portion and an oxide film in the thickness direction so as to be continuous with the oxide film at the bottom portion, the respective areas being insulated and separated from one another and sectioned by the embedded oxide film.

15. The semiconductor device according to claim 14, wherein the n resistance or capacitance elements are formed in the respective areas sectioned by the embedded oxide film and insulated and separated from one another in the SOI layer of the SOI structure semiconductor substrate having the embedded oxide film.

16. The semiconductor device according to claim 14, wherein n-multiplexed sectional areas are formed by the embedded oxide film, and the n transistor elements insulated and separated from one another are successively disposed in the n-multiplexed sectional areas one by one so that transistor elements at high stages are located at the inner side.

17. The semiconductor device according to claim 16, wherein the n resistance or capacitance elements are formed in the respective areas that are sectioned by the embedded oxide film and insulated and separated from one another in the SOI layer of the SOI structure semiconductor substrate having the embedded oxide film, and the n resistance or capacitance elements insulated and separated from one another are successively disposed one by one in the n-multiplexed sectional areas so that resistance or capacitance elements at higher stages are located at the inner side.

18. The semiconductor device according to claim 14, wherein a high concentration impurity layer that has the same conductivity type as the SOI layer and a high impurity concentration is formed on the embedded oxide film in the SOI layer.

19. The semiconductor device according to claim 14, wherein the SOI layer is an n-conductivity type.

20. The semiconductor device according to claim 1, wherein the semiconductor device is suitable for a level shift circuit in an inverter driving high voltage IC comprising a GND reference gate driving circuit having GND potential as reference potential, a float reference gate driving circuit having float potential as reference potential, a control circuit for controlling the GND reference gate driving circuit and the float reference gate driving circuit, and the level shift circuit that is interposed between the control circuit and the float reference gate driving circuit and level-shifts the input/output signal of the control circuit between the GND potential and the float potential, the predetermined potential being set to the float potential.

21. The semiconductor device according to claim 20, wherein the high voltage IC is an inverter driving high voltage IC for an in-vehicle mount type motor.

22. The semiconductor device according to claim 20, wherein the high voltage IC is an inverter driving high voltage IC for an in-vehicle mount type air conditioner.

* * * * *